(12) United States Patent
Oyabu

(10) Patent No.: US 6,673,196 B1
(45) Date of Patent: Jan. 6, 2004

(54) PLASMA PROCESSING APPARATUS

(75) Inventor: Jun Oyabu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 298 days.

(21) Appl. No.: 09/653,457

(22) Filed: Aug. 31, 2000

(30) Foreign Application Priority Data

Sep. 2, 1999 (JP) .......................................... 11-248299

(51) Int. Cl.$^7$ .............................. C23C 16/00; C23F 1/00
(52) U.S. Cl. ........................... 156/345.31; 156/345.47; 118/719; 118/723 E
(58) Field of Search ................................. 118/715, 719, 118/723 R, 723 E, 723 ER; 156/345, 345.47, 345.31, 345.32, 345.33

(56) References Cited

U.S. PATENT DOCUMENTS 5,044,311 A * 9/1991 Mase et al. ................. 118/723
5,772,833 A * 6/1998 Inazawa et al. ............. 156/345

FOREIGN PATENT DOCUMENTS

| JP | 2-30125 | 1/1990 |
| JP | 2-125430 | 5/1990 |
| JP | 7-147247 | 6/1995 |

* cited by examiner

Primary Examiner—Luz Alejandro-Mulero
(74) Attorney, Agent, or Firm—Oblon, Spivak, McClelland, Maier & Neustadt, P.C.

(57) ABSTRACT

The present invention provides a plasma processing apparatus, comprising a chamber for applying a film depositing treatment or an etching treatment to a target object by utilizing plasma, and a gate liner covering the surface of the open portion of a chamber gate for transferring the target object into and out of the chamber so as to prevent the chamber gate from being affected by the plasma. A gate aspect ratio, which is a ratio of the depth of the open portion of the chamber gate to the length in the short-side direction, is determined in accordance with the anode/cathode ratio, which is a ratio in area of the anode region to the cathode region within the chamber, so as to prevent an abnormal discharge within the gate space.

5 Claims, 5 Drawing Sheets

PLASMA PROCESSING APPARATUS

CROSS-REFERENCE TO RELATED APPLICATIONS

This application is based upon and claims the benefit of priority from the prior Japanese Patent Application No. 11-248299, filed Sep. 2, 1999, the entire contents of which are incorporated herein by reference.

BACKGROUND OF THE INVENTION

The present invention relates to a plasma processing apparatus for applying a plasma processing such as an etching treatment and a film-forming treatment to a target object such as a semiconductor wafer.

In general, in the manufacture of a semiconductor device or an LCD device, a plasma processing such as a dry etching or a plasma CVD (Chemical Vapor Deposition) treatment is employed in many cases.

In an apparatus for performing plasma processing, a pair of electrodes are arranged to face each other within a chamber. A high frequency power is applied between these electrodes under a reduced pressure of a process gas atmosphere within the chamber. As a result, the process gas is converted into a plasma, and a plasma processing such as an etching or deposition is applied to the target object. The target object used in the plasma processing includes, for example, a semiconductor wafer and a glass substrate for an LCD device.

A chamber gate, which is an opening through which a semiconductor wafer is transferred into and out of the chamber, is formed in a side wall of the chamber of the plasma processing apparatus. The chamber gate includes an open portion (hole) made through the chamber wall and a gate valve for opening/closing the open portion. The semiconductor wafer is transferred into and out of the chamber by opening the gate valve, and the chamber is sealed by closing the gate valve when a plasma processing is applied to the target object.

Since a negative pressure is established within the chamber in general, the gate valve is arranged to close the open portion from the outside. Therefore, if viewed from the side of the inner wall of the chamber, a locally recessed space, hereinafter referred to as "gate space", is formed because the chamber wall has a certain thickness.

In the conventional plasma processing apparatus, the inner wall of the chamber has an opening (i.e., gate space). The gate surface is therefore exposed through the opening of the inner wall. Therefore, if a plasma processing for deposition is carried out, an undesired thin film is attached to the gate surface and the open portion of the gate space. During maintenance of the plasma processing apparatus, it is necessary to remove the undesired thin film which causes the particle generation. In the conventional plasma processing apparatus, it is necessary to manually wipe off the undesired thin film attached to the open portion by using, for example, a cloth impregnated with a solvent after the gate valve is opened. It is also necessary to wipe off the undesired thin film attached to the gate surface from inside the chamber, with the gate kept closed. Alternatively, it is necessary to wipe off the undesired thin film after the gate valve is detached. Such being the situation, it was highly laborious to remove the undesired thin film attached to the gate plane, etc. of the plasma processing apparatus.

What should also be noted, in addition to the undesired thin film formation caused by the depositing treatment, is that, if the open portion is exposed to the plasma, the surface region of the open portion is scattered by a sputtering effect. In the worst case, it is necessary to renew the chamber itself, leading to a shortened life of the plasma processing apparatus.

On the other hand, the inner wall surface of the chamber is designed to be free from projections and to form a flat surface even in the case of providing a shield. However, a recess for transferring a semiconductor wafer is required in the gate space, making it impossible to provide a shield. It follows that a projecting space is formed when viewed from the plasma space. Where a plasma processing is carried out with the projecting space left formed, the plasma runs about the projecting space so as to give rise to an abnormal discharge within the gate space. If an abnormal discharge takes place in the gate space, the etching rate of the semiconductor wafer is increased in the vicinity of the gate, with the result that the uniformity of the etching rate over the entire surface of the semiconductor wafer is impaired.

For overcoming the difficulties described above, it was customary in the prior art to bring about an abnormal discharge positively in the region other than the gate space so as to acquire balance with the abnormal discharge taking place in the gate space. However, a fundamental resolution has not yet been arrived at.

BRIEF SUMMARY OF THE INVENTION

An object of the present invention is to provide a plasma processing apparatus that permits suppressing the abnormal discharge in the gate space so as to improve the maintenance capability of the chamber gate and prolong the life of the entire apparatus.

According to a first aspect of the present invention, there is provided a plasma processing apparatus for applying a plasma processing to a target object housed in a chamber, comprising a gate open portion formed in said chamber for transferring the target object into and out of the chamber, a gate valve for opening/closing the gate open portion, and a gate liner detachably mounted to cover the surface of the gate open portion and serving to prevent the gate open portion from being affected by the plasma during the plasma processing.

According to a second aspect of the present invention, there is provided a plasma processing apparatus, comprising a chamber whose inner space can be held in a vacuum state and in which a plasma processing is applied to a target object, an exhaust mechanism for exhausting the inner space of the chamber to establish a vacuum state, a gas introducing mechanism for introducing a process gas into the chamber, a lower electrode supporting the target object, an upper electrode arranged to face the lower electrode, a power source arranged outside the chamber for supplying an electric power to the electrodes so as to form a plasma of the process gas within the chamber, a gate open portion formed in the chamber for transferring the target object into and out of the chamber, and a gate valve for opening/closing the gate open portion, wherein a gate aspect ratio, which is a ratio of the depth of the opening of the chamber gate to the length in the short-side direction of the opening, is determined to prevent the abnormal discharge in the gate space in accordance with an anode/cathode ratio, which is a ratio of the area of the anode portion to the area of the cathode portion in the chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some embodiments of the present invention will now be described with reference to the accompanying drawings.

Figure 1:
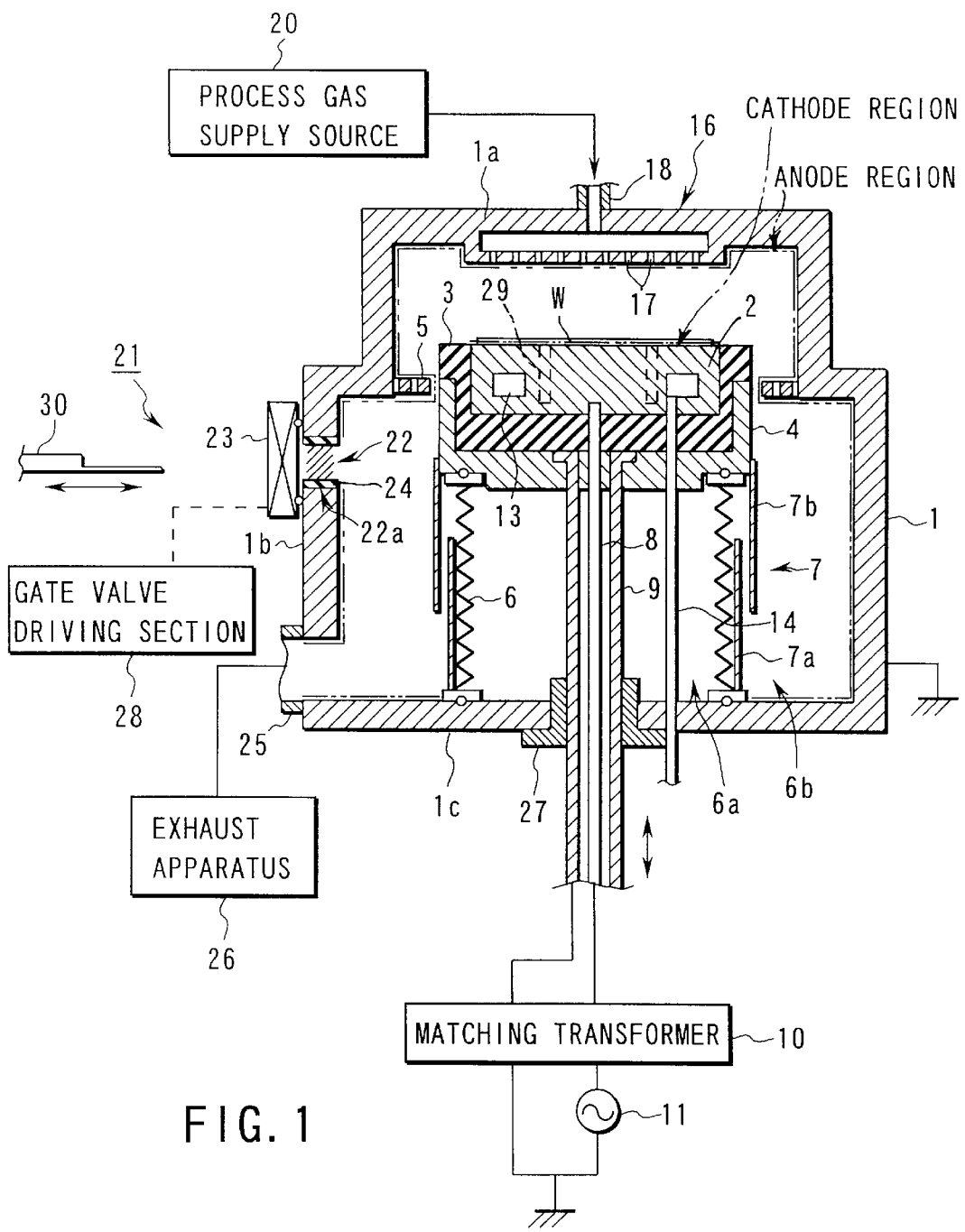
FIG. 1 is a cross sectional view schematically showing a plasma processing apparatus according to a first embodiment of the present invention.

FIG. 1 is a cross sectional view schematically showing the construction of a plasma processing apparatus according to a first embodiment of the present invention. A typical target object that is processed in this plasma processing is a semiconductor wafer or a glass substrate for an LCD device. In the following description, a semiconductor wafer is taken up as the target object.

The plasma processing apparatus comprises a conductive chamber 1 made of an aluminum plate having the inner surface formed of, for example, an anodized aluminum. The chamber 1 is connected to the ground. A lower electrode 2 for holding a semiconductor wafer W in parallel to an upper electrode, which is to be referred to herein later, is arranged within the chamber 1. The lower electrode 2 is disposed on a support table 4 made of a conductor such as aluminum. An annular baffle plate 5 for gas diffusion, which is provided with a large number of gas passing holes, is arranged along the inner circumferential surface of the wall of the chamber 1. The baffle plate 5 is made of a conductor such as aluminum and fixed to the chamber 1 by screws so as to achieve an electrical connection.

The lower electrode 2 performs the function of an electrostatic chuck (not shown) for electrostatically holding the semiconductor wafer W. The support table 4 is formed integral with an insulating member 3 and the lower electrode 2 and moved in a vertical direction within the chamber 1 by a lift mechanism (not shown).

A bellows 6 made of, for example, stainless steel is arranged between the lower portion of the support table 4 and the bottom wall of the chamber 1 so as to hermetically connect the lower portion of the support table 4 to the bottom wall of the chamber 1 by using, for example, an O-ring. The bellows 6 separates the inner space of the chamber 1 into an inner space 6a communicating with the air atmosphere and an outer space 6b held in a vacuum state. The bellows 6 is elongated or shrunk in accordance with the vertical movement of the support table 4 within the chamber 1. Cylindrical bellows cover 7 (7a, 7b) are arranged to cover the outer circumferential surface of the bellows 6. The bellows cover 7 is separated into a lower member 7a and an upper member 7b so as to permit the bellows cover 7 to be elongated or shrunk. Incidentally, if a slide contact 27, which is described herein later, is used in place of the driving system having a fluid, it is possible to omit using the bellows 6.

A high frequency power source 11 arranged below the chamber 1 is connected to the lower electrode 2 via a matching unit 10 and a power supply rod 8. A metal pipe 9 extending downward from the support table 4 is arranged to surround the power supply rod 8. A coolant path 13 is formed inside the lower electrode 2, and a coolant is circulated within the coolant path 13 through a coolant supply pipe 14.

Also, the lower electrode 2 is provided with a plurality of lift pins 29. When, for example, a semiconductor wafer is transferred onto or away from the lower electrode 2, these lift pins 29 are moved upward so as to permit the semiconductor wafer W to be transferred from a wafer transfer mechanism onto the tip portions of the lift pins 29 and, then, the lift pins 29 are moved downward so as to permit the semiconductor wafer W to be set on the lower electrode 2.

A shower head 16 acting as an upper electrode is arranged in a ceiling wall 1a of the chamber 1 in a manner to extend in parallel to the lower electrode 2. A large number of discharge ports 17 are formed in a lower end portion of the shower head 16. On the other hand, a gas inlet port 18 is formed above the shower head 16. A process gas supply source 20 for supplying a predetermined process gas into the chamber 1 through the shower head 16 is connected to the gas inlet port 18.

The process gas is supplied into the chamber 1, and a high frequency power is applied to the lower electrode 2 to form a plasma in the space between the lower electrode 2 and the shower head 16. As a result, a predetermined plasma processing is applied to the semiconductor wafer W.

On the other hand, a chamber gate 21 for transferring the semiconductor wafer W into or out of the chamber 1 is formed in a side wall 1b of the chamber 1. The chamber gate 21 comprises an open portion 22 made in the chamber 1, a gate valve 23 capable of opening/closing the open portion 22 from the outside, and a gate valve driving unit 28 for opening/closing the gate valve 23.

Further, a gate liner 24 made of a metal or a ceramic material is detachably mounted to cover an end face (side wall) 22a of the open portion 22. The gate liner 24 is made of a metal such as an aluminum member having the surface formed of an anodized aluminum. Where the gate liner 24 is made of a ceramic material, it is conceivable to use alumina for forming the gate liner 24. Needless to say, however, the materials of the gate liner 24 are not limited to those exemplified above. Incidentally, the metal is superior to the ceramic material in terms of the heat dissipation capability, the potential, etc. when it comes to the material of the gate liner 24. Further, it is desirable to apply a blast treatment to the surface of the gate liner 24 so as to roughen the surface of the gate liner 24. In this case, an additional treatment is applied to the roughened surface to make the surface of the gate liner 24 unlikely to be peeled off. Further, in the case of using a material poor in the heat conductivity, it is desirable to use a heater or the like to control the temperature of the gate liner 24 in accordance with the temperature elevation of the plasma atmosphere so as to make an undesirable film unlikely to be formed and to make the undesirable film, if formed, readily peeled off.

Since the open portion 22 is covered with the gate liner 24, the open portion is not exposed directly to the plasma atmosphere, making it possible to prevent a damage done by the plasma. Also, in order to fix the gate liner 24 detachable from the open portion 22, it is possible to screw the gate liner 24 by using a screw made of a material equal to that used for forming the gate liner 24 such that the screwed surface is rendered flat. It is also possible to use a recess type in place of a screw.

An exhaust port 25 is arranged in the vicinity of the bottom portion of the side wall 1b of the chamber 1. An exhaust device 26 is connected to the exhaust port 25 via a pipe. By operating the exhaust device 26, the inner space of the chamber 1 can be exhausted to a predetermined degree of vacuum.

The pipe 9 referred to previously is electrically connected to the bottom wall 1c of the chamber 1 via the slide contact 27 referred to previously. The slide contact 27 makes it possible to have the pipe 9 kept in contact with the bottom wall 1c of the chamber 1 even if the lower electrode 2 is moved in a vertical direction.

The plasma processing apparatus of the construction described above is operated as follows. In the first step, the lower electrode 2 is moved in a vertical direction by a lift mechanism (not shown) to reach a position adapted for reception of a semiconductor wafer W. Then, the gate valve 23 is opened so as to permit a transfer arm 30 to transfer the semiconductor wafer W into the chamber 1 through the open portion 22. Further, the semiconductor wafer W is set on the lower electrode 2 by using the lift pins 29, followed by allowing the transfer arm 30 to retreat from within the chamber 1 and, then, closing the gate valve 23. In this step, the wafer W is held by the electrostatic chuck on the lower electrode 2.

In the next step, the lower electrode 2 is move upward by a lift mechanism to set the gap between the lower electrode 2 and the shower head 16 at a predetermined length. Under this condition, a coolant is circulated through the coolant path 13 so as to control the lower electrode 2 at a predetermined temperature. At the same time, the exhaust device 26 is operated to exhaust the inner space of the chamber 1 so as to set up a state of a high vacuum.

Then, a predetermined process gas is supplied from the process gas supply source 20 into the chamber 1 through the process gas inlet port 18. The process gas introduced into the chamber 1 is spurted from the gas discharge ports 17 of the shower head 16 onto the semiconductor wafer W. In this step, the pressure within the chamber 1 is set at scores of about 10 mTorr by operating the exhaust device 26. Also, a high frequency power of a predetermined frequency and voltage is applied from the high frequency power source 11 to the lower electrode 2 through the matching unit 10 and the power supply rod 8. As a result, a plasma atmosphere of the process gas is formed in the space between the lower electrode 2 and the shower head 16. It follows that a predetermined plasma processing is applied to the semiconductor wafer W.

During the plasma processing, the plasma flows into the space below the lower electrode 2, with the result that the open portion 22 in the gate space is exposed to the plasma atmosphere. In this embodiment, the gate liner 24 is arranged to cover the open portion 22. Thus, an undesired film is attached to the gate liner 24. It follows that the undesired film can be removed easily, if the gate liner 24 is detached from the chamber 1 and washed during maintenance of the plasma processing apparatus.

It should also be noted that, even if an etching function is caused by the plasma atmosphere, only the surface of the gate liner 24 is etched. Thus, it suffices to renew the gate liner 24 alone, making it possible to prevent a damage done to the chamber 1 by the plasma atmosphere. Incidentally, the gate liner 24 is made of a metal or a ceramic material as described previously and, thus, exhibits a high resistance to plasma, leading to a long life. Also, since a metal or a ceramic material exhibits a high bonding strength to deposition, the undesired film attached to the gate liner 24 is unlikely to be peeled off, making it possible to prevent the particle generation caused by the peeling of the undesired attached film.

A second embodiment of the present invention will now be described.

Figure 2:
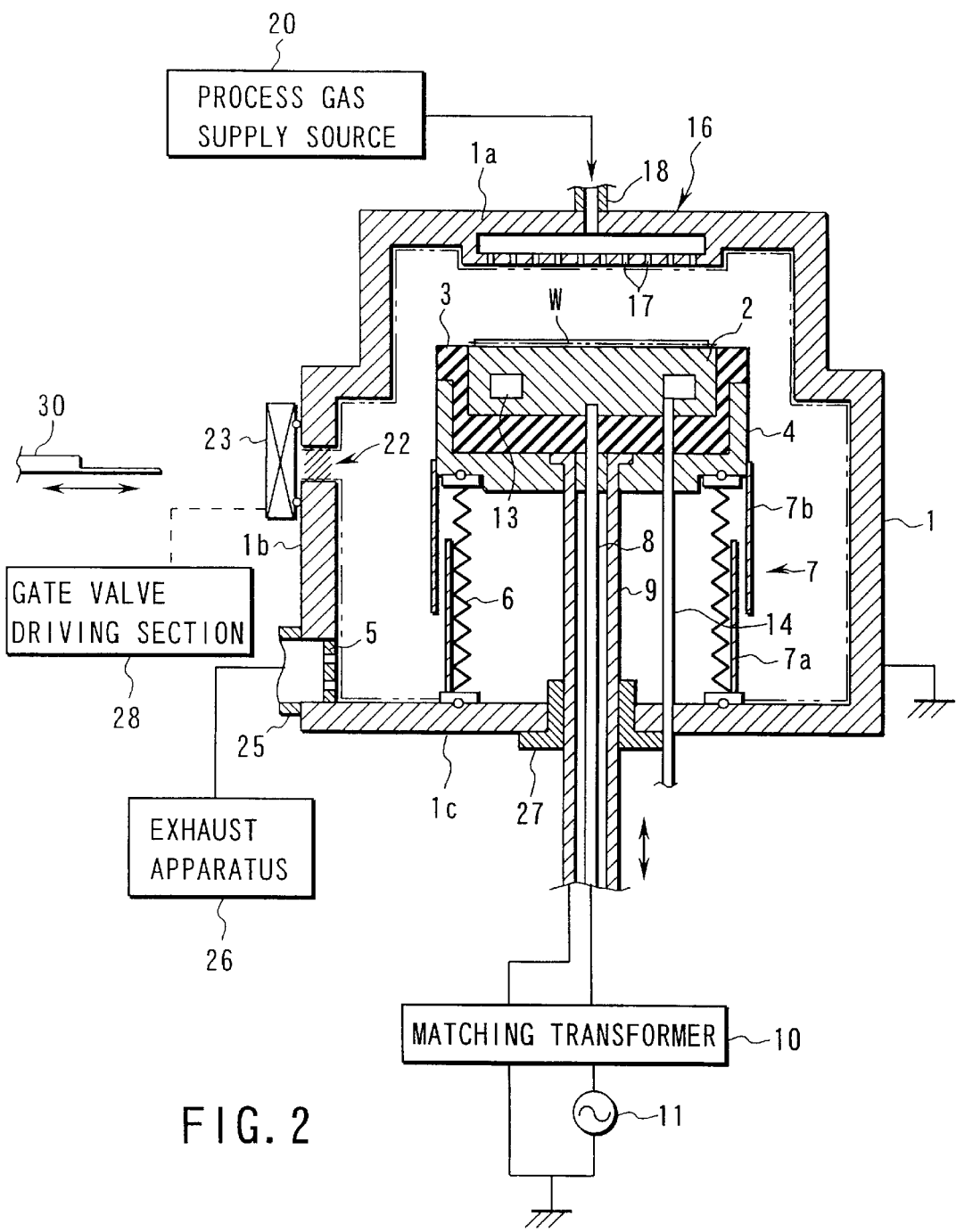
FIG. 2 is a cross sectional view schematically showing a plasma processing apparatus according to a second embodiment of the present invention.

Specifically, FIG. 2 is a cross sectional view schematically showing the construction of a plasma processing apparatus according to the second embodiment of the present invention. The plasma processing apparatus according to the second embodiment is substantially equal in construction to the apparatus of the first embodiment shown in FIG. 1, except that, in the second embodiment, the chamber gate 21 is not provided with the gate liner 24, and that a gate aspect ratio in the chamber gate is defined as described in the following. Incidentally, in the first embodiment described previously, the baffle 5 is arranged in the position of the lower electrode moved up and down. In the second embodiment, however, the baffle plate 5 is arranged in the connecting portion of the exhaust pipe 25.

Description of those portions of the apparatus which overlap with the members of the apparatus of the first embodiment is omitted in the following description.

Figure 3:
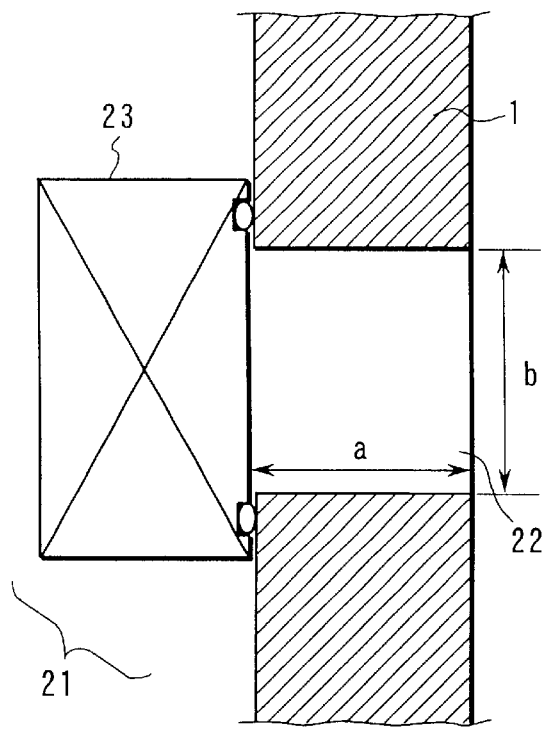
FIG. 3 shows the construction of a chamber gate included in the plasma processing apparatus according to the second embodiment of the present invention.

FIG. 3 shows the construction of the chamber gate 21 in the second embodiment of the present invention. Specifically, FIG. 3 shows a depth a of the chamber gate (thickness of the wall of the chamber 1) and a length b in the short-side direction of the chamber gate in the open portion inside the chamber.

In the second embodiment of the present invention, the value of a ratio a/b, hereinafter referred to as a gate aspect ratio, is determined in accordance with an anode/cathode ratio. In this embodiment, a range of a gate aspect ratio within which an abnormal discharge is not generated within the gate space is obtained on the basis of the anode/cathode ratio.

To be more specific, the gate aspect ratio is determined as follows.

In the first step, obtained is an anode/cathode ratio, which is a ratio in an area (volume) of an anode region to a cathode region of the plasma processing apparatus used. Then, a range of a gate aspect ratio within which an abnormal discharge is not generated within the gate space is obtained by experiments or by simulation on the basis of the anode/cathode ratio thus obtained so as to determine the gate aspect ratio to fall within the range noted above. Incidentally, the anode region implies the entire region within the chamber 1 having the GND potential except the space between the gas discharge ports 17 of the shower head 16 and the ceiling wall 1a of the chamber 1 and the region surrounded by the bellows cover 7. On the other hand, the cathode region implies that region of the upper surface of the lower electrode to which a high frequency power is applied. For example, the gate aspect ratio is determined on the basis of the relationship shown in FIG. 6. To be more specific, FIG. 6 shows the presence or absence of the abnormal discharge in the gate space in the plasma processing apparatus in conjunction with the relationship between the anode/cathode ratio and the gate aspect ratio together with the frequency of the power applied for the plasma processing.

Figure 6:
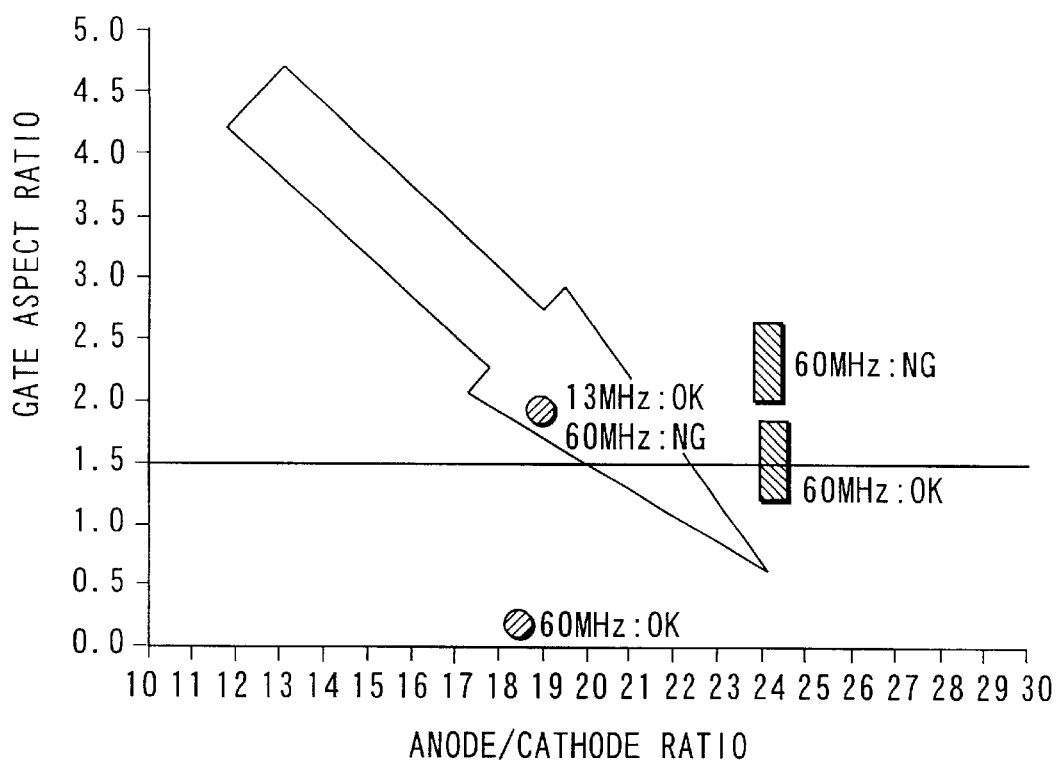
FIG. 6 shows the presence or absence of the abnormal discharge in the gate space in conjunction with the relationship between the anode/cathode ratio and the gate aspect ratio.

An abnormal discharge within the gate space took place in the region denoted by "NG" In FIG. 6, and an abnormal discharge did not take place in the region denoted by "OK". As apparent from FIG. 6, an abnormal discharge is unlikely to take place in the gate space in the apparatus having a high anode/cathode ratio and a low gate aspect ratio, i.e., in the direction denoted by a white arrow in FIG. 6, where the frequency of the applied power is the same.

The experimental data given in FIG. 6 suggests that the abnormal discharge in the gate space can be suppressed by controlling the anode/cathode ratio and the gate aspect ratio to fall within preferred ranges. To be more specific, the abnormal discharge is unlikely to take place with increase in the anode/cathode ratio and with decrease in the gate aspect ratio (direction denoted by the white arrow in the drawing), as apparent from FIG. 6.

It is difficult to control freely the value of the anode/cathode ratio because the ratio is substantially constant depending on the plasma processing apparatus. Therefore, in the second embodiment of the present invention, the gate aspect ratio is set at a value that does not cause an abnormal discharge within the gate space in accordance with the anode/cathode ratio of the apparatus.

FIG. 6 shows that, if the gate aspect ratio is not larger than 1.5, an abnormal discharge does not take place regardless of the value of the anode/cathode ratio as far as the anode/cathode ratio falls within the range of the ratio of the ordinary plasma processing apparatus. It follows that the abnormal discharge in the plasma processing apparatus can be prevented by setting the gate aspect ratio at 1.5 or less.

Since it is possible to suppress the abnormal discharge occurring within the gate space by constructing the chamber gate 21 to permit the plasma processing apparatus to have the gate aspect ratio thus determined, it is possible to apply uniformly a plasma processing to the semiconductor wafer W.

It is possible to combine the plasma processing apparatus of the second embodiment described above with the apparatus of the first embodiment described previously. To be more specific, it is possible to mount the gate liner to the chamber gate and to determine the gate aspect ratio within the gate space so as to prevent the abnormal discharge.

Figure 4:
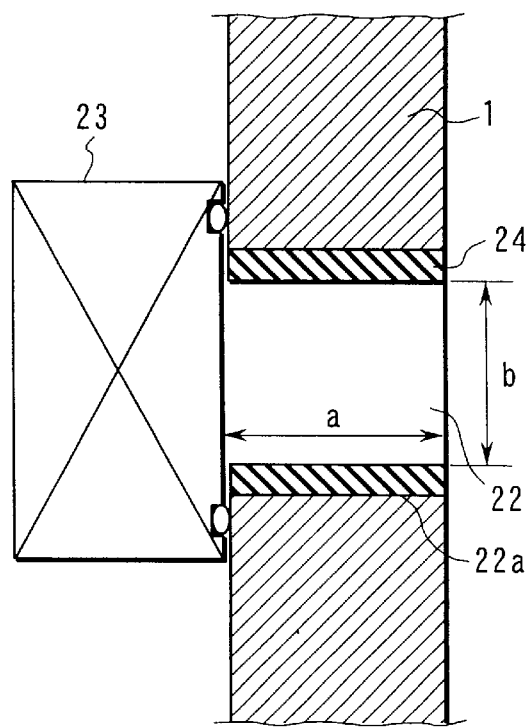
FIG. 4 shows the construction of a chamber gate having a gate liner arranged therein.
Figure 5:
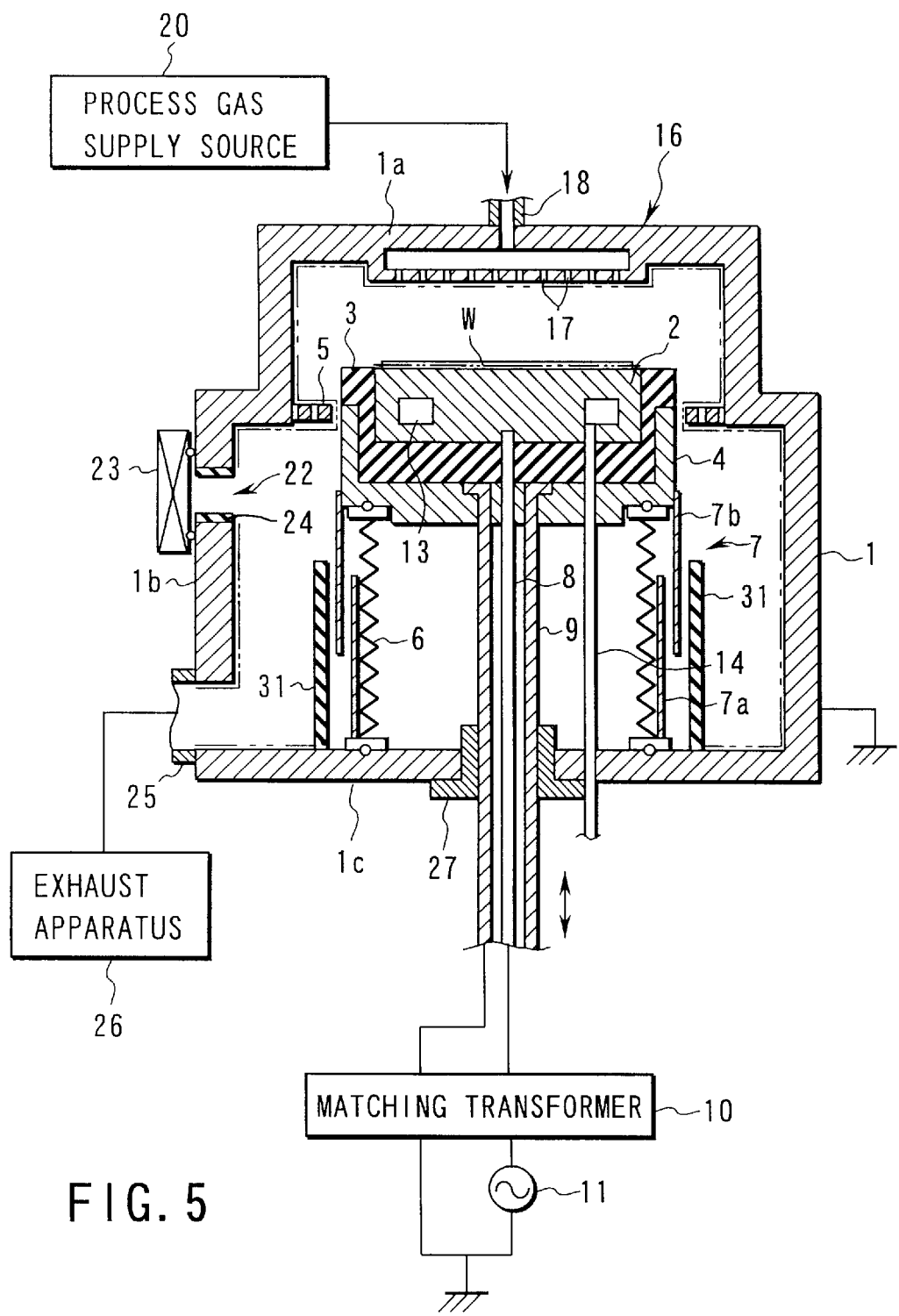
FIG. 5 is a cross sectional view schematically showing the construction of a plasma processing apparatus according to the first embodiment of the present invention having a bellows ring added thereto.

FIG. 4, which shows the construction of the chamber gate 21 having the gate liner 24 arranged therein, shows a depth a of the chamber gate and the length k in the short-side direction of the chamber gate in the open portion 22 inside the chamber 1. The gate aspect ratio (a/b) in the case of arranging the gate liner 24 can be obtained from the values of a and b shown in FIG. 4.

In each of the embodiments described above, a small clearance is provided between the lower member 7a and the upper member 7b of the bellows cover 7 in order to permit the bellows 6 to be elongated and shrunk. What should be noted is that it is possible for an abnormal discharge caused by a glow discharge to take place in the small clearance noted above, giving rise to an abnormal wear of the upper member 7b. In order to overcome the problem, it is effective to arrange a bellows ring 31 made of, for example, a ceramic material (A1203) outside the lower member 7a extending upward from the bottom wall 1c so as to allow the bellows ring 31 to protect the overlapping portion of the lower member 7a and the upper member 7b.

As described above, the bellows ring 31 arranged outside the bellows cover 7 serves to insulate the overlapping portion of the upper member 7b and the lower member 7a of the bellows cover 7 from plasma. It is desirable for the bellows ring 31 to be as high as possible so as to diminish as much as possible the area of the upper member 7b exposed to plasma.

In each of the embodiments described above, a high frequency power is applied to the lower electrode to form a plasma, thereby applying a plasma processing to a semiconductor wafer. However, the present invention is not limited to the particular construction of the apparatus. Specifically, the present invention can be applied easily to any type of a plasma processing apparatus, as far as a plasma is generated within a chamber having a reduced pressure so as to apply a plasma processing to a target object, and the apparatus comprises a chamber gate for transferring a target object into and out of the chamber and a gate space.

Also, the target object to which the plasma processing is applied is not limited to a semiconductor wafer. For example, the plasma processing can be applied in the present invention to a glass substrate for a liquid crystal display device.

As described above, a gate liner made of a metal or a ceramic material is detachably mounted inside the chamber gate in the present invention. Therefore, even if deposition of an undesired film or an etching of the surface takes place during the plasma processing, the gate liner can be detached for washing or renewal during maintenance of the plasma processing apparatus. It follows that the maintenance operation can be performed easily and a damage done to the apparatus itself can be prevented so as to prolong the life of the apparatus, compared with the conventional plasma processing apparatus.

It should also be noted that, in the present invention, the gate liner is made of a metal or a ceramic material to which an undesired film is attached with a high bonding strength. It follows that the undesired film once attached to the gate liner is unlikely to peel off, making it possible to suppress the particle generation.

What should also be noted is that, in the present invention, the gate aspect ratio, which is a ratio of the depth of the chamber gate to the length of the short-side direction of the chamber gate in the open portion inside the chamber, is determined in accordance with the anode/cathode ratio, which is a ratio in area of the anode portion to the cathode portion within the chamber. Alternatively, the gate aspect ratio is set at 1.5 or less. As a result, it is possible to suppress generation of an abnormal discharge within the gate space, and a uniform plasma processing can be applied to the target object.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing apparatus, comprising:
a chamber whose inner space can be held in a vacuum state and in which a plasma processing is applied to a target object;
an exhaust mechanism for exhausting the inner space of the chamber to establish a vacuum state;
a gas introducing mechanism for introducing a process gas into the chamber;
a lower electrode supporting the target object;
an upper electrode arranged to face the lower electrode;
a power source arranged outside the chamber for supplying an electric power to the electrodes so as to form a plasma of the process gas within the chamber;
a gate open portion formed in the chamber for transferring the target object into and out of the chamber; and
a gate valve for opening/closing the gate open portion,
wherein a gate aspect ratio, which is a ratio of a depth of the gate open portion to a width of the gate open portion, is at most 1.5, and an anode/cathode ratio, which is a ratio of an area of an anode portion to an area of a cathode portion in the chamber falls within a range of 18 to 25.

2. The plasma processing apparatus according to claim 1, further comprising a gate liner detachably mounted to cover a surface of the gate open portion and serving to prevent the gate open portion from being affected by the plasma during the plasma processing.

3. The plasma processing apparatus according to claim 2, wherein said gate liner is made of a metal.

4. The plasma processing apparatus according to claim 2, wherein said gate liner is made of an aluminum plate having the surface formed of an anodized aluminum.

5. The plasma processing apparatus according to claim 2, wherein said gate liner is made of a ceramic material.

* * * * *